United States Patent [19]
Decramer

[11] Patent Number: 5,633,614
[45] Date of Patent: *May 27, 1997

[54] UNBALANCED TO BALANCED SIGNAL LINE COUPLING DEVICE

[75] Inventor: John E. Decramer, Marshall, Minn.

[73] Assignee: BH Electronics, Inc., Burnsville, Minn.

[ * ] Notice: The term of this patent shall not extend beyond the expiration date of Pat. No. 5,495,212.

[21] Appl. No.: 574,494

[22] Filed: Dec. 19, 1995

Related U.S. Application Data

[63] Continuation of Ser. No. 358,739, Dec. 19, 1994, Pat. No. 5,495,212.

[51] Int. Cl.$^6$ ........................................... H03H 7/42
[52] U.S. Cl. .............................. 333/25; 333/32
[58] Field of Search ........................ 333/12, 25, 32, 333/181, 185; 343/859

[56] References Cited

U.S. PATENT DOCUMENTS

| | | |
|---|---|---|
| 1,812,624 | 6/1931 | Cummings . |
| 3,223,920 | 12/1965 | Sasaki . |
| 3,311,831 | 3/1967 | Leppert . |
| 3,352,966 | 11/1967 | Sawazaki et al. . |
| 4,037,177 | 7/1977 | Tyrey ................................. 333/32 |
| 4,201,960 | 5/1980 | Hosoga ............................. 333/25 |
| 4,670,874 | 6/1987 | Sato et al. ...................... 370/110.1 |
| 4,717,896 | 1/1988 | Graham ........................... 333/25 |
| 4,766,402 | 8/1988 | Crane .............................. 333/25 |
| 4,885,747 | 12/1989 | Foglia ............................. 370/123 |
| 5,010,399 | 4/1991 | Goodman et al. ............... 358/85 |
| 5,027,426 | 6/1991 | Chiocca, Jr. .................... 455/5 |
| 5,126,702 | 6/1992 | Gris ................................ 333/24 R |
| 5,170,493 | 12/1992 | Roth .............................. 455/82 |
| 5,200,718 | 4/1993 | Kato .............................. 333/25 |
| 5,283,637 | 2/1994 | Goolcharan ..................... 348/17 |
| 5,420,551 | 5/1995 | Conte et al. .................... 333/25 X |

*Primary Examiner*—Paul Gensler
*Attorney, Agent, or Firm*—Palmatier, Sjoquist, Helget & Voigt, PA

[57] ABSTRACT

Disclosed is a passive, highly efficient, low noise coupling device that includes a balun and noise reduction circuitry uniquely configured for converting an unbalanced video signal on a 75 ohm transmission line or connector to a balanced signal on a 100 ohm transmission line or connector and vice versa. The device efficiently allows use of a 100 ohm unshielded twisted pair, such as a conventional telephone cable, for multiplex transmission of video signals or the like in the frequency range of 50 to 500 megahertz. The preferred embodiment has a circuit board with a 75 ohm unbalanced side and a 100 ohm balanced side separated by a balun having a toroid core with a very high permeability. A common mode choke for noise rejection is inserted in the balanced side. The choke has a dual toroid core, one core of high permeability and one of low permeability, and has windings with a 100 ohm characteristic impedance. A common mode toroid shunt on the device's balanced side provides further noise reduction. Circuit board traces connecting the components are impedance matched to either the balanced side or the unbalanced side as appropriate.

20 Claims, 2 Drawing Sheets

5,633,614

1

UNBALANCED TO BALANCED SIGNAL LINE COUPLING DEVICE

This application is a continuation of Ser. No. 08/358,739 filed Dec. 19, 1994, now U.S. Pat. No. 5,495,212.

BACKGROUND OF THE INVENTION

The present invention relates to transmission systems for video signals. More specifically the invention relates to a low noise coupling device to couple a shielded unbalanced video signal to a balanced two wire unshielded twisted pair.

Cable television (CATV) is transmitted over 75 ohm coaxial cable. Channels 2 through 60 are transmitted on the cable at frequencies ranging from 50 to 500 megahertz. Many homes and commercial buildings have previously installed telephone cable consisting of unshielded twisted pairs. Standard unshielded twisted pairs (UTP) of telephone cable have a characteristic impedance of 100 ohms. On occasion it is desirable to utilize this cable for transmission of video signals, this is especially true where standard cable television cable has not been installed or the cost differential to install UTP versus coaxial cable is significant.

There are difficulties associated with using the unshielded twisted pair (UTP) cable. First, the transmission through standard CATV coaxial cable is unbalanced. Any attempt to utilize the UTP cable with unbalanced signals will result in unacceptable radiation and attenuation of the CATV signals. Conventional techniques of matching and balancing the cables do not offer optimal performance across the broad frequency range utilized by CATV signals. Less than optimal matching can dramatically shorten the length of UTP cable that can be used to transmit such video signals without amplification.

Moreover, in that UTP is unshielded it is much more susceptible to noise or other RF interference. Conventional noise reduction techniques or devices are either not effective across the broad CATV frequency spectrum, are overly complex, and/or tend to cause excessive attenuation to the video signals.

SUMMARY OF THE INVENTION

Disclosed is a passive, highly efficient, low noise coupling device that includes a balun and noise reduction circuitry uniquely configured for converting an unbalanced video signal on a 75 ohm transmission line or connector to a balanced signal on a 100 ohm transmission line or connector and vice versa. The device efficiently allows use of a 100 ohm unshielded twisted pair, such as a conventional telephone cable, for multiplex transmission of video signals in the frequency range of 50 to 500 megahertz. The typical utilization will have a first coupling device connected between the 75 ohm cable carrying the CATV signal and the beginning of the UTP cable and a second coupling device connected at the other end of the UTP cable to convert back to a 75 ohm unbalanced signal for input into the television receiver or other video device.

The preferred embodiment has a circuit board with a 75 ohm unbalanced side and a 100 ohm balanced side separated by a balun having a toroid core with a very high permeability. A common mode choke for noise rejection is inserted in the balanced side. The choke has a dual toroid core, one core of high permeability and one of low permeability, and has windings with a 100 ohm characteristic impedance. A common mode toroid shunt on the device's balanced side provides further noise reduction. Circuit board traces connecting the components are impedance matched to either the balanced side or the unbalanced side as appropriate.

A feature and advantage of the invention is that the device permits efficient use of UTP cable to carry CATV signals or the like. A further advantage is that the invention accomplishes said use passively.

A feature and advantage of the invention is that the device provides excellent noise reduction characteristics over the broad frequency range associated with CATV.

A feature and advantage of the invention is that the two of the units described can be used at each end of the section of UTP wire. That is one of the devices can be utilized to couple between the 75 ohm unbalanced line and the 100 ohm balanced line and an addition identical device can also be used to couple the 100 ohm balanced line and the 75 ohm unbalanced line at the video device.

DETAILED DESCRIPTION OF THE PREFERRED EMBODIMENTS

Figure 1:
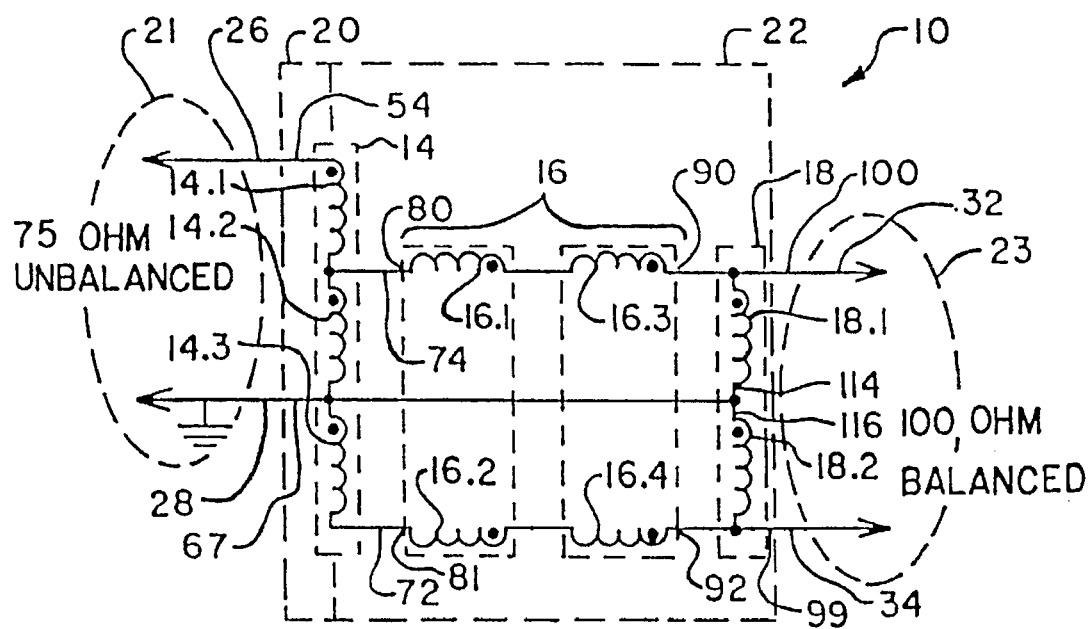
FIG. 1 is a schematic diagram of the invention.

Referring to FIG. 1, a schematic of the preferred embodiment of the invention is depicted with the device generally indicated with the numeral 10. The device 10 is inserted between an unbalanced signal line with a first characteristic impedance of 75 ohms and a balanced line with a second characteristic impedance of 100 ohms. The device 10 is principally comprised of a balun 14, with three sets of windings 14.1, 14.2, 14.3, a choke 16, with four sets of winding s 16.1, 16.2, 16.3, 16.4 and a common mode shunt 18 with two sets of windings 18.1, 18.2, on the FIG. 1 schematic. The device can be characterized as having a unbalanced side 20 and a balance side 22 which are separated by the balun 14. The unbalanced side 20 of the device is connectable through an unbalanced side port 21 to a signal line having the first characteristic impedance such as a 75 ohm coaxial cable. The balanced side 22 of the device is connectable through a balanced side port 23 to a balanced line such as a 100 ohm unshielded, twisted pair UTP.

Figure 2:
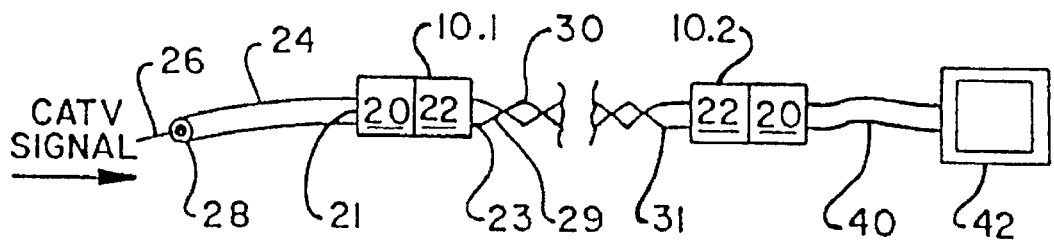
FIG. 2 is a block diagram of an application of the invention utilizing two of the described devices.

Referring to FIG. 2, one application of the invention is shown. The coaxial cable 24 comprised of an inner conduit 26 carrying a CATV or like signal between a grounded outer conductor shield 28 connected to the unbalanced side 20 of a first device 10.1, and the balanced side 22 of said device 10.1 is connected to a first end 29 of the unshielded twisted pair (UTP) cable 30. The opposite end or second end 31 of the UTP 30 is connected to the balanced side 22 of a second identical device 10.2. The unbalanced side 20 of said device 10 connected by way of coaxial cable 40 or other suitable connector directly to the end video device 42 such as a television receiver.

Figure 3:
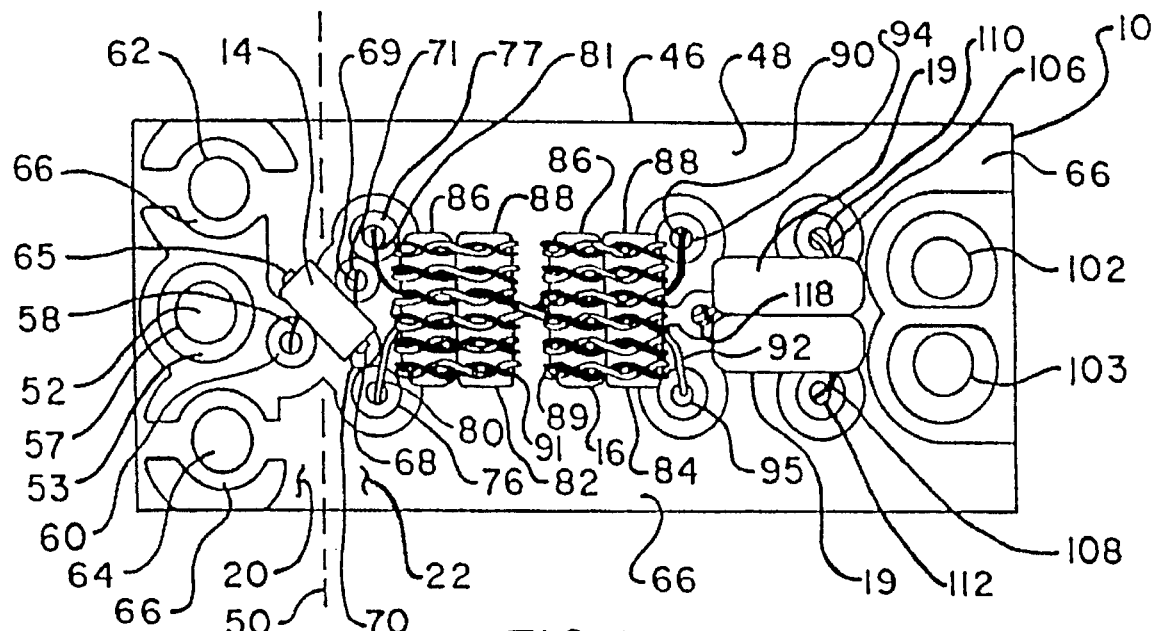
FIG. 3 is a top plan view of the device.
Figure 4:
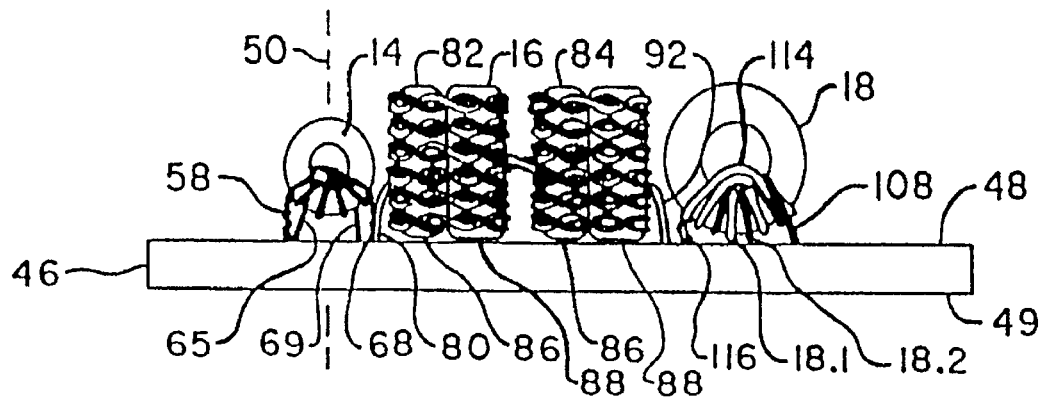
FIG. 4 is a side elevational view of the invention.
Figure 5:
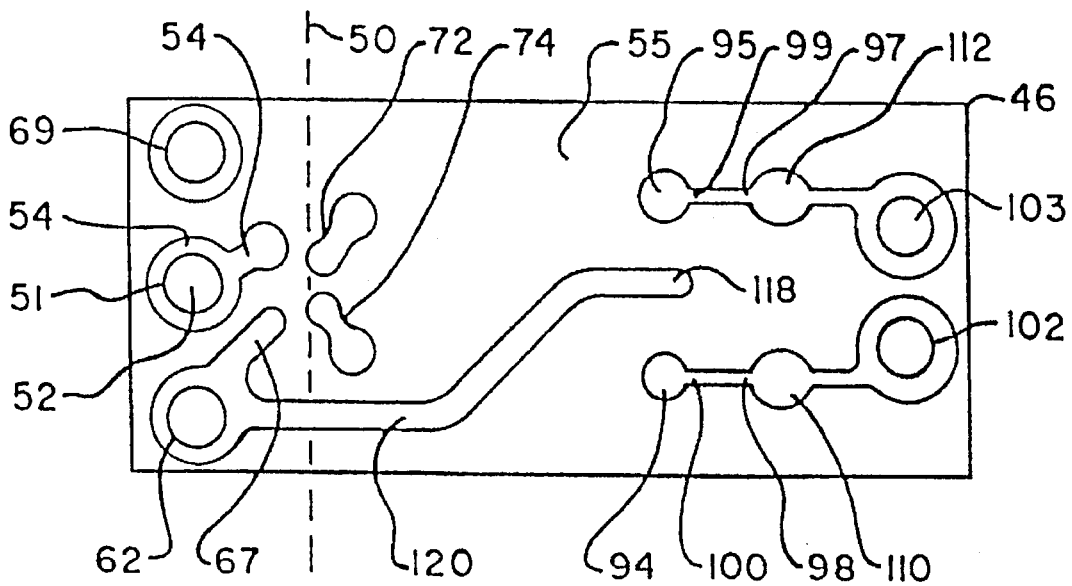
FIG. 5 is a bottom plan view of the circuit board for the device.

Referring to FIGS. 3, 4 and 5, a top plan view, a side elevational view, and bottom plan view of a suitable embodiment of the device 10 is shown. A circuit board 46 is utilized for mounting and supporting the principal components, the balun 14, the choke 16, and the shunt 18. The circuit board may be conventionally manufactured of epoxy fiberglass material such as FR4. The board has a top side 48 and a bottom side 49 with copper cladding on both sides. The unbalanced side 20 and the balanced side 22 are shown generally separated by the balun 14 and dashed line 50. The unbalanced side 20 has a terminal junction 51 including a hole 52 extending through the board 46 and a trace 54 encircling said hole. The terminal junction 51 connects to the balun 14 via a first input signal line 54 on the bottom side 55, shown in FIG. 5. Said first input signal line 54 is connected to the balun 14 at the first input lead 58 to the balun 14 by way of terminal junction 60. The unbalanced side 20 of the device 10 also has two terminal junctions 62, 64 for connection to the outer shielded conductor 28. Said terminal junctions 62, 64 are connected to a ground trace 66 which extends across the length of the top side 48 of the board 46 and generally surrounds each of the various other terminal junctions. The terminal junctions 62, 64 that connect to the outer shielded conductor are electrically connected to the balun 14 at a second balun input lead 65 by way of a second input signal line 67 shown as a trace on the bottom side 49 of the board 46. The balun 14 has two output leads 68, 69 which are respectively connected to terminal junctions 70, 71. The terminal junctions 70, 71 are connected to balun output traces 72, 74 located on the bottom of the board 46. The balun output traces 72, 74 connect to terminal junctions 76, 77 which are soldered to the pair of input ends 80, 81 of the choke 16. The balun 14 may have a toroid core with a permeability of at least 1000.

The choke 16 as shown is comprised of two sets of toroid core pairs 82, 84. Each set of toroid core pairs 82, 84 is comprised of a ferrite first toroid core 86 of very high permeability and a powdered iron second toroid core 88 of relatively low permeability. Suitably, the first ferrite core will have a permeability at least 4000 greater than the second powdered iron core. Appropriate permeability would be 10,000 for the ferrite core and 35 for the powered iron core. The high permeability core provides more attenuation of low frequency noise whereas the low permeability core provides more efficient attenuation in the high frequency range. As shown in FIG. 3, the windings 16.1, 16.2, 16.3, 16.4 on said pairs of toroid cores consists of a single pair of wires 89, 91 twisted together, one of which is shown in outline 89 and the other shown in solid 91, before they are wound on each of the pairs of toroid core 82, 84. Each of the wires 89, 91 has a conductor portion and an insulation portion. The conductor portion and insulation portion are appropriately sized and the insulation portion material is suitably selected to give the twisted pair substantially a 100 ohm characteristic impedance matching the second characteristic impedance. The applicant has found that 34 gauge wire with a 0.0095 inches of Teflon™ (PTFE) insulation provides for the appropriate characteristic impedance for the twisted pair of windings 16.1, 16.2, 16.3, 16.4. The pair of twisted wires 89, 91 may have 10 turns of 34 AWG wire on each of the pairs 82, 84 of cores.

Opposite the input ends 80, 81 of the choke are the choke output ends 90, 92 which are soldered to terminal junctions 94, 95. The terminal junctions 94, 95 are connected to traces 97, 98 which function as output signal lines 99, 100 and which connect to the output terminal junctions 102, 103.

Straddling the output signal lines 99, 100 is the common mode shunt 18. The common mode shunt 18 has a first winding 18.1 and a second winding 18.2 which are shown in FIG. 4 in outline and in solid respectively. The windings 18.1, 18.2 respectively have a first winding lead 106 and a second winding lead 108 connected to two terminal junctions 110, 112. The two windings 18.1, 18.2 also have a first winding grounded lead 114 and a second winding grounding lead 116 which are both soldered to terminal junction 118. Said junction 118 is connected to a trace 120 on the bottom side 49 of the board 46 which goes to terminal junction 62 which is connected to the grounded trace 66. The first winding and the second winding each may suitably have six turns on the toroid core. As depicted, the toroid core has dual cores. Both cores suitably are powdered iron cores with a permeability of 35.

The device operates as follows: Referring to FIG. 2, two of the devices 10.1, 10.2 may be inserted on each end 29, 31 of the UTP cable 30. The unbalanced sides 20 of each device are conventionally connected to the shielded CATV signal carrying cable 24 and the cable 40 or connector attached to the television receiver 42 or other video device. The balanced sides 22 of each device are conventionally connected to each end 29, 31 of the UTP cable 30. Referring to FIG. 1, the balun 14 is configured to balance the unbalanced signals. The number of turns of first winding 14.1 plus the second winding 14.2 to the second winding 14.2 plus the third winding 14.3 is 9:10 which substantially provides an increase in the characteristic impedance from 75 to 100 ohms.

The balanced signal leaving the balun 14 is transmitted by way of the balun output signal lines which are comprised of the traces 72, 74 on the bottom side of the circuit board 46. The traces 72, 74 are suitably configured and spaced to maintain the 100 ohm impedance. The balanced signal then enters the choke 16 in which the windings 16.1, 16.2, 16.3, 16.4 are wound to provide a very high impedance to any unbalanced signals which would be characteristic of noise, and a very low impedance to the balanced signals. The dual core arrangement provides a wide band of noise attenuation. The use of two sets of pairs of cores distances the input and output of the choke and provides for minimal capacitive coupling. The balanced and noise reduced signal then exits the output ends 90, 92 of the choke and are connected to the output signal lines 99, 100 which are comprised of the traces 97, 98 on the bottom side 55 of the board. The common mode shunt 18 is connected across the output signal lines 99, 100. The shunt 18 has the two windings 19.1, 19.2 configured such that any unbalance signals sees a very low impedance to ground, and the balanced signals see a very high impedance to ground.

The common mode choke 16 and common mode shunt 18 effectively minimize any extraneous incident noise on the 75 ohm cable. Moreover they operate to isolate the 75 ohm cable from any unbalanced noise from the 100 ohm cable.

The output signal devices 99, 100 are suitably connected to the existing UTP cable. At the opposite end of the UTP cable an additional second device 10 is connected to the UTP cable at the balanced side terminal junctions of the second device. The CATV signal then enters and passes through the second device in a reverse fashion from what was previously described. However, the components function in like manner. Any noise which was picked up on the UTP cable is rejected or shunted to ground through the common mode choke 16 and common mode shunt 18. The balanced signal is converted into an unbalanced signal by way of the balun and further is converted to 75 ohms. The 75 ohms is then connected to a cable or suitable connector for connection to the television receiver or other video device.

The use of "input" and "output" as used herein with reference to components is a matter of convention for differentiating the leads on the components and does not indicate that the signals must be transmitted in a particular direction through the device or component. As described above, with reference to FIGS. 1 and 2, the CATV signals enter the second device 10.2 at the output signal lines 99, 100 and exit at the input signal lines 54, 67.

The present invention may be embodied in other specific forms without departing from the spirit or essential attributes thereof, and it is therefore desired that the present embodiment be considered in all respects as illustrative and not restrictive, reference being made to the appended claims rather than to the foregoing description to indicate the scope of the invention.

What is claimed is:

1. A coupling device for connection between an unbalanced signal line having a first characteristic impedance and a balanced signal line having a second characteristic impedance, the unbalanced signal line including a grounded conductor, the coupling device comprising:
   a) a balun comprised of a pair of balun input leads, a pair of balun output leads, and a core, the input leads electrically connected to the unbalanced signal line, the balun configured for matching the first characteristic impedance to the second characteristic impedance and for providing a balanced signal at the output leads;
   b) a common mode choke comprised of a core, a pair of windings having a pair of input ends and a pair of output ends, the input ends of the windings electrically connected to the balun output leads and the pair of output ends electrically connected to the balanced signal line by a pair of output signal lines; and
   c) a common mode shunt comprised of a core, first winding with a first winding lead and an opposite first winding grounded lead, and a second winding with a second winding lead and an opposite second winding grounded lead, the first winding grounded lead and the second winding grounded lead electrically connected to the grounded conductor, the first winding lead and second winding lead connected to the output signal lines.

2. The coupling device of claim 1, further comprising a circuit board upon which the balun, the common mode choke, and the common mode shunt are mounted, the balun output signal lines disposed on said circuit board, said signal lines suitably configured and spaced to maintain the second characteristic impedance.

3. The coupling device of claim 2, wherein the pair of output signal lines are disposed on the circuit board the output signal lines connecting the output ends of the common mode choke to the balanced signal lines, the output signal lines configured and spaced to have a characteristic impedance substantially matching the second characteristic impedance.

4. The coupling device of claim 1, wherein the pair of windings of the common mode choke are twisted together, each of the windings comprising a conductor portion and an insulation portion, the conductor portions and the insulation portions configured so that the pair of windings has a characteristic impedance substantially matching the second characteristic impedance.

5. The coupling device of claim 2, further comprising a pair of input signal lines disposed on the circuit board, the input signal lines configured and spaced to have a characteristic impedance substantially matching the first characteristic impedance the input signal lines connecting the unbalanced signal line to the balun input leads.

6. The coupling device of claim 1, wherein the common mode choke further comprises a pair of toroid cores, the pair of windings wound on said toroid cores, the toroid cores having substantially different permeability from each other.

7. The coupling device of claim 6 wherein one of the toroid cores is comprised of powdered iron toroid and the other is a ferrite toroid.

8. The coupling device of claim 4 wherein the insulating portions are comprised of PTFE.

9. The coupling device of claim 6 wherein the balun has a toroid core with a permeability of at least 1000.

10. A coupling device for connection between an unbalanced signal line having a first characteristic impedance and a balanced signal line having a second characteristic impedance, the unbalanced signal line including a grounded conductor, the balanced signal line comprising an unshielded twisted pair of wires, the coupling device comprising:
    a) an input port connectable to the unbalanced signal line and an output port connectable to the balanced signal line;
    b) a balun comprised of a pair of balun input leads, a pair of balun output leads, and a core having a permeability of at least 1,000, the input leads electrically connected to the input port, the balun configured for matching the first characteristic impedance to the second characteristic impedance and for providing a balanced signal at the output leads; and
    c) a common mode choke comprised of a core, a pair of windings, a pair of input ends, and a pair of output ends, wherein the pair of windings of the common mode choke are twisted together, each of the windings comprising a conductor portion and an insulation portion, the conductor portions and the insulation portions configured to provide a spacing between the conductor portions such that the twisted pair of windings has a characteristic impedance substantially matching the second characteristic impedance, the input ends of the windings electrically connected to the balun output leads, the output ends electrically connected to the output port.

11. The coupling device of claim 10 further comprising a pair of output signal lines, whereby the output ends of the common mode choke are electrically connected to the output port through said output signal lines, the output signal lines configured to have a characteristic impedance substantially equal to the second characteristic impedance.

12. The coupling device of claim 11, further comprising a common mode shunt comprised of a first winding, and a second winding, each winding having two leads, one of the leads from the first winding and one of the leads from the second winding electrically connected to the grounded conductor, the other lead from the first winding and the other lead from the second winding connected across the output signal lines.

13. The coupling device of claim 12, further comprising a circuit board upon which the balun, the common mode choke, and the common mode shunt are mounted.

14. The coupling device of claim 10 wherein the common mode choke further comprises a pair of cores, the cores each having a substantially different permeability from one another.

15. The coupling device of claim 13, further comprising a pair of input signal lines disposed on the circuit board, the input signal lines configured and spaced to have a characteristic impedance substantially matching the first characteristic impedance, the input signal lines connecting the unbalanced signal line to the balun input leads.

16. The coupling device of claim 14, wherein the common mode choke further comprises a second pair of cores, the pair of windings wound on the first pair of cores extending to and wound on the second pair of cores, the second pair of cores each having a substantially different permeability from each other.

17. The coupling device of claim 16 wherein each of the two sets of cores are comprised of a powdered iron core and a ferrite core.

18. The coupling device of claim 14 wherein the insulating portions are comprised of PTFE.

19. A coupling device for connection between an unbalanced video transmission cable having a first characteristic impedance and a balanced unshielded pair of wires having a second characteristic impedance, the coupling device comprising:

a) a mounting board;
   b) a pair of signals lines disposed on the board, the input lines connectable to the unbalanced video transmission cable;
   c) a balun having a core, a first winding, a second winding, a third winding, the three windings connected in series, and a pair of balun output leads, the core having a permeability exceeding 1000, the input signal lines connected across the first winding and the second winding, the output signal lines connected across the second and third windings, the balun having a turns ratio of the first and second windings to the second and third windings such that the balun has an output impedance substantially matching the second characteristic impedance;
   d) a common mode choke comprised of a first core, a second core, and a pair of windings, the first core having a permeability at least 4000 higher than the second core, the pair of windings twisted together, the windings having a pair of input ends and a pair of output ends, each of the windings having a conductor portion and an insulation portion, the conductor portion and the insulation portion configured so that the pair of wires has a characteristic impedance substantially matching the second characteristic impedance, the input ends of the winding electrically connected to the balun output leads;
   e) a pair of output signal lines positioned on the board, the output signal lines connectable to the unshielded pair of wires, the output signal lines connected to the output end of the common mode choke output ends; and
   f) a common mode shunt comprised of a core, a first winding, and a second winding, the first winding and the second winding connected at a grounded junction, the first and second windings connected across the output signal lines.

20. The coupling device of claim 19, wherein the output signal lines are sized and spaced on the board to substantially match the second characteristic impedance of the unshielded pair and, wherein the input signal lines are sized and spaced on the board to substantially match the first characteristic impedance of the video transmission cable.

* * * * *